(12) United States Patent
Ganesan et al.

(10) Patent No.: US 7,509,602 B2
(45) Date of Patent: Mar. 24, 2009

(54) COMPACT PROCESSOR ELEMENT FOR A SCALABLE DIGITAL LOGIC VERIFICATION AND EMULATION SYSTEM

(75) Inventors: Subbu Ganesan, Saratoga, CA (US); Leonid Alexander Broukhis, Fremont, CA (US); Ramesh Narayanaswamy, Palo Alto, CA (US); Ian Michael Nixon, Sunnyvale, CA (US); Thomas Hanni Spencer, Sunnyvale, CA (US)

(73) Assignee: Eve S.A., Parc Gutenberg, Palaiseau (FR)

( * ) Notice: Subject to any disclaimer, the term of this patent is extended or adjusted under 35 U.S.C. 154(b) by 165 days.

(21) Appl. No.: 11/307,130

(22) Filed: Jan. 25, 2006

(65) Prior Publication Data

US 2006/0277234 A1 Dec. 7, 2006

Related U.S. Application Data

(60) Provisional application No. 60/595,057, filed on Jun. 2, 2005.

(51) Int. Cl.
*G06F 17/50* (2006.01)
*G06F 15/80* (2006.01)
*G06F 7/38* (2006.01)

(52) U.S. Cl. .............................. 716/4; 712/22; 712/223

(58) Field of Classification Search ..................... 716/4; 712/10, 22, 223
See application file for complete search history.

(56) References Cited

U.S. PATENT DOCUMENTS

| | | | | |
|---|---|---|---|---|
| 4,306,286 | A | * | 12/1981 | Cocke et al. .................... 703/15 |
| 5,526,278 | A | * | 6/1996 | Powell ......................... 716/16 |
| 2003/0037305 | A1 | * | 2/2003 | Chen et al. ..................... 716/4 |
| 2003/0131030 | A1 | * | 7/2003 | Sebot et al. .................. 708/209 |
| 2004/0237004 | A1 | * | 11/2004 | Adkisson ...................... 714/47 |

OTHER PUBLICATIONS

IEEE Standards Board (1993), IEEE Standard Multivalue Logic System for VHDL Model Interoperability ( Std_logic_1164), IEEE Standards.*
Singh, K. J., Subrahmanyam, P. A. (1995), Extracting RTL Models from Transistor Netlists, Proceedings of the 1995 IEEE/ACM International Conference on Computer-aided Design, 11-17.*
Chrzanowska-Jeske, M. (1993), Architecture and Technology of FPGAs—an overview, Northcon/93 Conference Record, 82-86.*

* cited by examiner

*Primary Examiner*—Jack Chiang
*Assistant Examiner*—Aric Lin
(74) *Attorney, Agent, or Firm*—Patentry

(57) ABSTRACT

A logic simulation acceleration processor optimized for multi-value logic level simulation of electronic systems described in hardware description languages.

3 Claims, 12 Drawing Sheets

| XOR(ABCD) | D B= | 0 0 | 0 1 | 0 X | 0 Z | 1 0 | 1 1 |
|---|---|---|---|---|---|---|---|
| C A= | | | | | | | |
| 0 0 | | 0 | 1 | X | X | 1 | 0 |
| 0 1 | | 1 | 0 | X | X | 0 | 1 |
| 0 X | | X | X | X | X | X | X |
| 0 Z | | X | X | X | X | X | X |
| 1 0 | | 1 | 0 | X | X | 0 | 1 |
| 1 1 | | 0 | 1 | X | X | 1 | 0 |
| 1 X | | X | X | X | X | X | X |
| 1 Z | | X | X | X | X | X | X |
| X 0 | | X | X | X | X | X | X |
| X 1 | | X | X | X | X | X | X |
| X X | | X | X | X | X | X | X |
| X Z | | X | X | X | X | X | X |
| Z 0 | | X | X | X | X | X | X |
| Z 1 | | X | X | X | X | X | X |
| Z X | | X | X | X | X | X | X |
| Z Z | | X | X | X | X | X | X |

FIG. 2

// an Octal wide shift operation

// Shifts a 64-bit value 'old' (in fact needs only 63 bits)
// right by ' shift' (< 32) and returns the low 32 bits.
// Unconditionally ORs the result with replicated 'xout' module widevarshift(out, old, shift, xout);
output[31:0] out;
input[63:0] old;
input[4:0] shift;
input xout;

assign out = (old >> shift) | {32{xout}};

endmodule

FIG. 3A

```
//shifting wider bit vectors
wire[127:0] tmp, a;
wire[6:0] shamt;
reg[127:0] test;

// test = a >> shamt;

widevarshift u0 (tmp[31:0], a[63:0], shamt[4:0], 1'b0);
    widevarshift u1 (tmp[63:32], a[95:32], shamt[4:0], 1'b0);
    widevarshift u2 (tmp[95:64], a[127:64], shamt[4:0], 1'b0);
    widevarshift u3 (tmp[127:96], {32'b0, a[127:96]}, shamt[4:0], 1'b0);

always @(tmp or shamt)
    case (shamt[6:5])
    2'b00: test = tmp;
    2'b01: test = {32'b0, tmp[127:32]};
    2'b10: test = { 64'b0, tmp[127:64]};
    2'b11: test = { 96'b0, tmp[127:96]};
    endcase
```

FIG. 3B

// Octal wide replace range operation:

// Conditionally (based on 'enable') replaces some part of 'old'
// with lower 'width'+1 bits of 'new' shifted left (if enable[0] is true)
// or right (otherwise) by 'shift' or 32 minus 'shift' respectively, and
// unconditionally ORs the result with replicated 'xout' module replacerange(out, old, new, width, shift, enable, xout);
output[31:0] out;
reg[31:0] out;
input[31:0] old, new;
input[4:0] width;
input[4:0] shift;
input xout;
input[1:0] enable; // can never be 2'b11

// width is offset by 1, because width == 0 does not make sense

FIG. 4A

```
always @(old or new or width or shift or enable or xout) begin : a
reg[31:0] mask, rot, rmask;
reg[4:0] rshamt;
casex(width)
5'd00: mask = 32'h00000001;
5'd01: mask = 32'h00000003;
5'd02: mask = 32'h00000007;
5'd03: mask = 32'h0000000f;
5'd04: mask = 32'h0000001f;
5'd05: mask = 32'h0000003f;
5'd06: mask = 32'h0000007f;
5'd07: mask = 32'h000000ff;
5'd08: mask = 32'h000001ff;
5'd09: mask = 32'h000003ff;
5'd10: mask = 32'h000007ff;
5'd11: mask = 32'h00000fff;
5'd12: mask = 32'h00001fff;
5'd13: mask = 32'h00003fff;
5'd14: mask = 32'h00007fff;
5'd15: mask = 32'h0000ffff;
5'd16: mask = 32'h0001ffff;
5'd17: mask = 32'h0003ffff;
5'd18: mask = 32'h0007ffff;
5'd19: mask = 32'h000fffff;
5'd20: mask = 32'h001fffff;
5'd21: mask = 32'h003fffff;
5'd22: mask = 32'h007fffff;
5'd23: mask = 32'h00ffffff;
5'd24: mask = 32'h01ffffff;
5'd25: mask = 32'h03ffffff;
5'd26: mask = 32'h07ffffff;
5'd27: mask = 32'h0fffffff;
5'd28: mask = 32'h1fffffff;
5'd29: mask = 32'h3fffffff;
5'd30: mask = 32'h7fffffff;
5'd31: mask = 32'hffffffff;
endcase
```

FIG. 4B

```
casex(shift)
5'd00: rshamt = 5'd0; // really must be 32, but it is taken care of below
5'd01: rshamt = 5'd31;
5'd02: rshamt = 5'd30;
5'd03: rshamt = 5'd29;
5'd04: rshamt = 5'd28;
5'd05: rshamt = 5'd27;
5'd06: rshamt = 5'd26;
5'd07: rshamt = 5'd25;
5'd08: rshamt = 5'd24;
5'd09: rshamt = 5'd23;
5'd10: rshamt = 5'd22;
5'd11: rshamt = 5'd21;
5'd12: rshamt = 5'd20;
5'd13: rshamt = 5'd19;
5'd14: rshamt = 5'd18;
5'd15: rshamt = 5'd17;
5'd16: rshamt = 5'd16;
5'd17: rshamt = 5'd15;
5'd18: rshamt = 5'd14;
5'd19: rshamt = 5'd13;
5'd20: rshamt = 5'd12;
5'd21: rshamt = 5'd11;
5'd22: rshamt = 5'd10;
5'd23: rshamt = 5'd09;
5'd24: rshamt = 5'd08;
5'd25: rshamt = 5'd07;
5'd26: rshamt = 5'd06;
5'd27: rshamt = 5'd05;
5'd28: rshamt = 5'd04;
5'd29: rshamt = 5'd03;
5'd30: rshamt = 5'd02;
5'd31: rshamt = 5'd01;
endcase
```

FIG. 4C rot = enable[0] ? new << shift : new >> rshamt;

// rshamt == 0 really means rshamt == 32, i.e. shift everything away
rmask = enable[0] ? mask << shift : enable[1] & |rshamt ? mask >> rshamt : 32'b0;

out = (old & ~rmask) | (rot & rmask) | {32{xout}};

end

FIG. 4D

COMPACT PROCESSOR ELEMENT FOR A SCALABLE DIGITAL LOGIC VERIFICATION AND EMULATION SYSTEM

CROSS-REFERENCE TO RELATED APPLICATIONS

The present application claims the benefit of priority under 35 USC .sctn. 119(e) from U.S. provisional patent application 60/595,057 filing date Jun. 2, 2005 first named inventor Ganesan, titled: "Massively parallel platform for accelerated verification of hardware and software."

FIELD OF THE INVENTION

The present invention relates to the electronic design of integrated circuits, and more specifically to a method for the functional verification of a target integrated circuit design.

RELATED ART

Functional verification is one of the steps in the design of integrated circuits. Functional verification generally refers to determining whether a design representing an integrated circuit performs a function it is designed for. The inventors have previously disclosed functional verification systems (U.S. Pat. Nos. 6,691,287, 6,629,297, 6,629,296, 6,625,786, 6,480,988, 6,470,480, and 6,138,266) in which a target design is partitioned into many combinational logic blocks connected by sequential elements. The state tables corresponding to the logic blocks are evaluated and stored in multiple random access storage devices (RASDs). Such an approach may have several disadvantages. For example, evaluation of 4 state logic may require multiple cycles. Some target designs may contain new language constructs such as provided by Verilog 2000. Accordingly, the embodiments of previous patents may not fully addresses the issues of ever larger, faster, and more complex electronic system emulation and simulation.

Thus it can be appreciated that what is needed is a hardware acceleration chip that provides circuit evaluation instruction processing in a manner that reduces the amount of time to simulate or emulate a large and complex system.

SUMMARY OF THE INVENTION

The present invention is an apparatus for processing logic evaluation instructions compiled from a high level abstract description of an electronic design. Typically written in a hardware description language suitable for synthesis, these designs are targeted for fabrication in a large number semiconductor devices with defined functionality, performance, testability, and manufacturability in a rapid design cycle. The processor is a component of a scalable simulation system of high speed and capacity.

Conceptually the present invention comprises electronic devices and circuitry for reading parameterized instructions, electronic devices and circuitry for reading a variable plurality of operands encoding digital circuit signal values of greater than two states, and electronic devices and circuitry for setting a plurality of output bits to the evaluated digital circuit signal value according to the parameterized instruction applied to certain operands, wherein the default value of output bits at initialization is set to the encoding denoted as UNKNOWN just as a simulator defines all wires prior to the beginning of a simulation.

The present invention addresses the growth in size and complexity of electronic products which exceed the capacity or useful performance of conventional logic simulators. With arrays of the processors, a scalable system may contain and efficiently evaluate circuit signal values. Designers may determine in a timely manner if the design of a complex circuit does not provide the desired functionality or contains errors of timing or inadequate performance prior to the expense of fabricating the design in semiconductor manufacturing facilities. As a result electronic designers can bring a novel product to market sooner and at lower cost.

A BRIEF DESCRIPTION OF DRAWINGS

FIG. 2 is a portion of a truth table illustrating a 4 input 4 value XOR processor instruction.

FIG. 3 is an embodiment in Verilog HDL of the wide variable shift processor apparatus.

FIG. 4 is an embodiment in Verilog HDL of the replace range processor apparatus.

Figure 1:
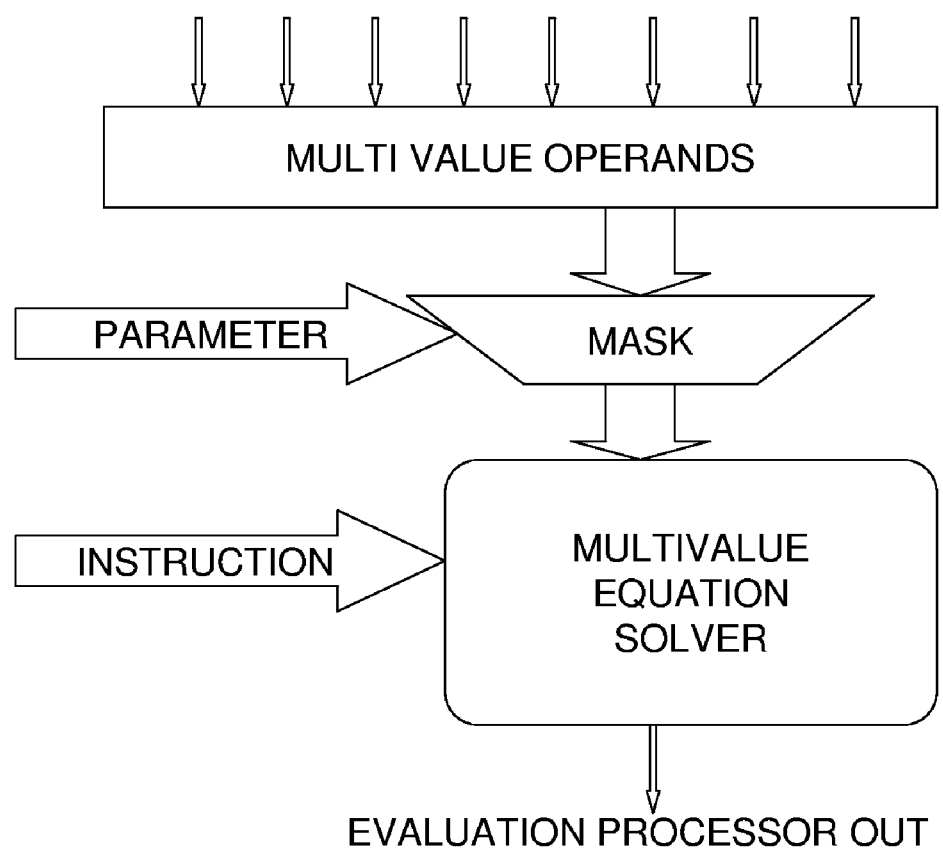
FIG. 1 is a block diagram of an evaluation processor.
Figure 5A:
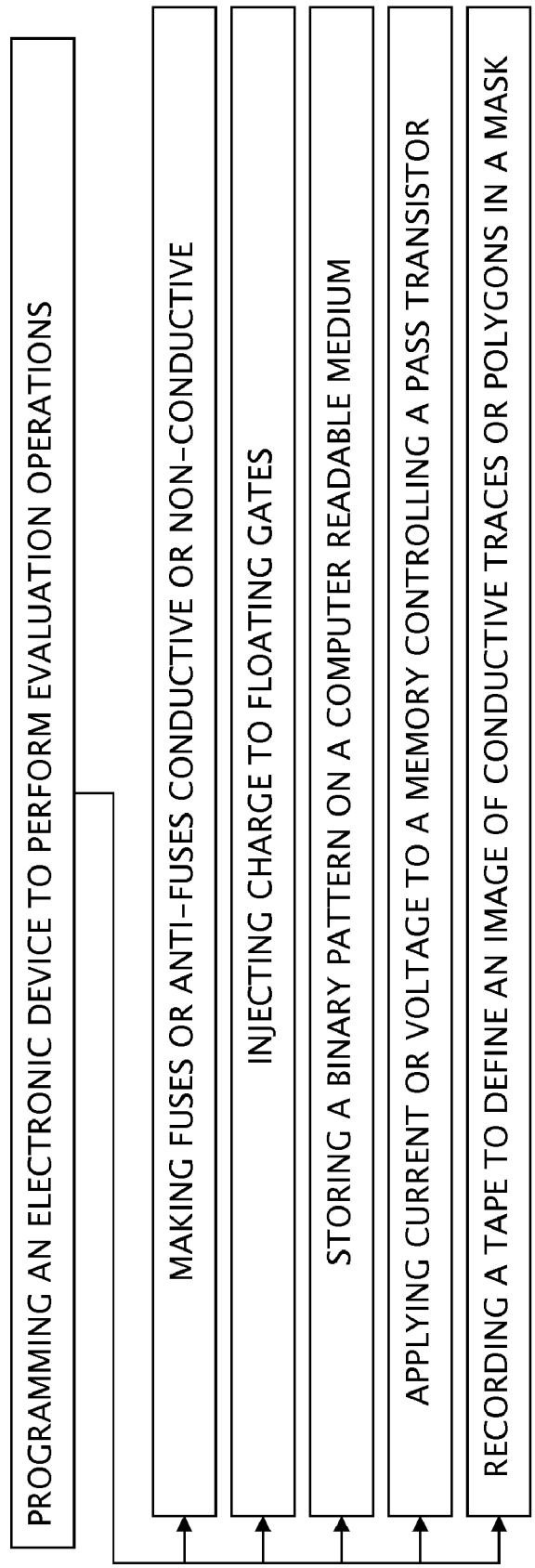
Figure 5B:
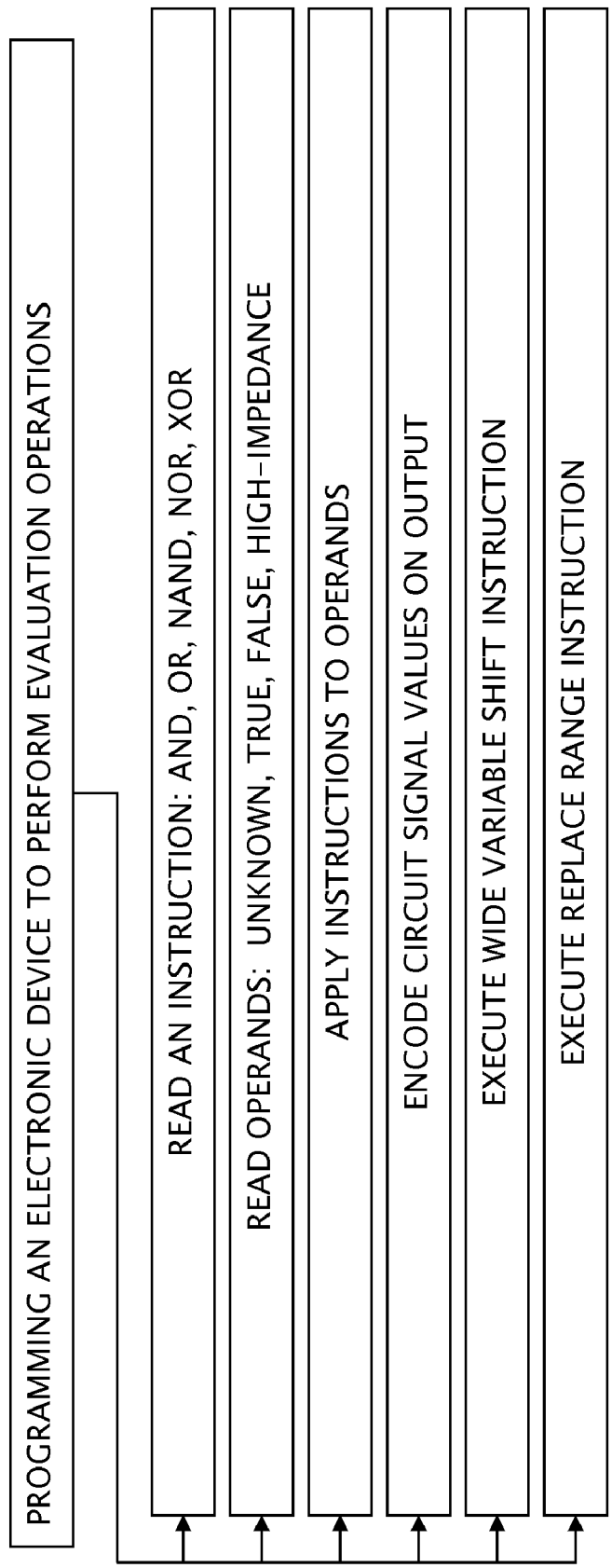
Figure 5C:
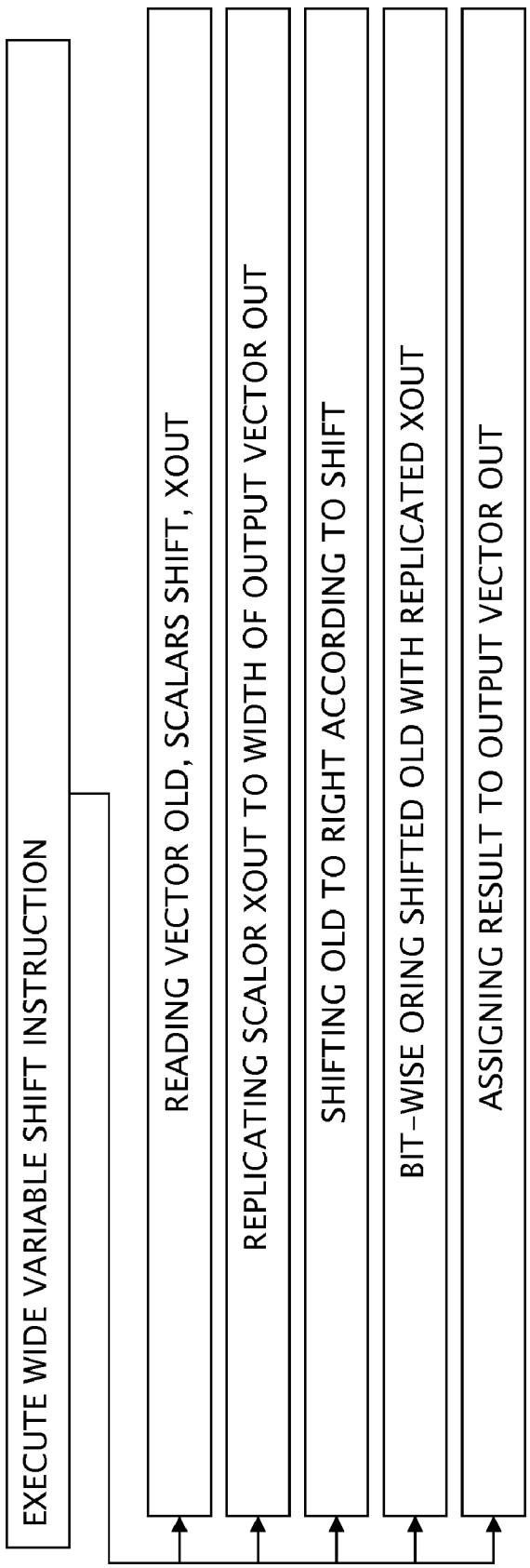
Figure 5D:
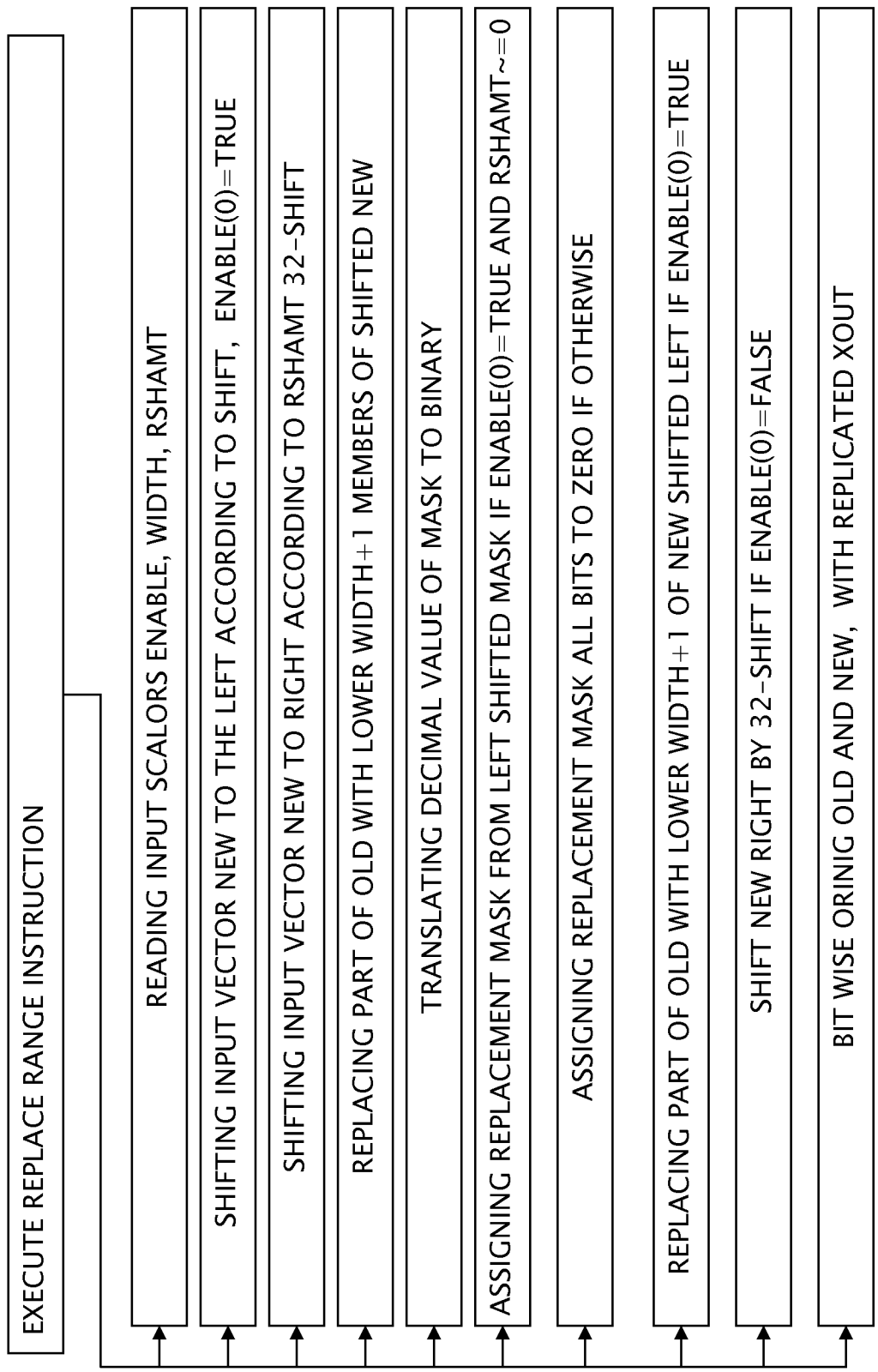

FIG. 5A-D are flowcharts of methods disclosed in the application.

DETAILED DESCRIPTION

A processor is disclosed, for evaluating circuit signal values of an electronic design, comprising operand inputting ports for reading four or more operands, instruction input ports for reading one or more processor instructions, and encoding circuit drivers for encoding four or more circuit signal values onto a plurality of output bits.

The processor further has a number of inputs for reading one or more instruction parameters, the parameter comprising a specification of the operands to which the instruction applies. In an embodiment the processor can operate on up to 8 circuit signal values as inputs to a single instruction. Conventional simulators operate on the first two values and then operate on a third value with the result of the prior binary operation, as a result taking 7 cycles to accomplish the evaluation on 8 circuit signal values.

The processor further has decoding circuits for decoding four or more circuit signal values encoded in each operand, the values comprising UNKNOWN, TRUE, FALSE, and HIGH-IMPEDANCE whereby a logic circuit design can be verified for errors in functionality or timing within four value logic simulation.

The processor further has logic AND electronic devices and circuitry for encoding the following circuit signal values when the instruction is AND:
TRUE, on the condition that all of the circuit signal values of the operands specified by the parameter are TRUE,
FALSE, on the condition that any of the circuit signal values of the operands specified by the parameter are FALSE,
UNKNOWN, on the condition that any of the circuit signal values of the operands specified by the parameter are TRUE, UNKNOWN or HIGH-IMPEDANCE but not all TRUE.

The processor further has logic NAND electronic devices and circuitry for encoding the following circuit signal values when the instruction is NAND:
TRUE, on the condition that any of the circuit signal values of the operands specified by the parameter are FALSE,
FALSE, on the condition that all of the circuit signal values of the operands specified by the parameter are TRUE,
UNKNOWN, on the condition that any of the circuit signal values of the operands specified by the parameter are TRUE, UNKNOWN or HIGH-IMPEDANCE but not all TRUE.

The processor further has logic OR electronic devices and circuitry for encoding the following circuit signal values when the instruction is OR:
TRUE, on the condition that any of the circuit signal values of the operands specified by the parameter are TRUE, FALSE, on the condition that all of the circuit signal values of the operands specified by the parameter are FALSE, UNKNOWN, on all other combinations of circuit signal values of the operands specified by the parameter.

The processor further has logic NOR electronic devices and circuitry for encoding the following circuit signal values when the instruction is NOR:

TRUE, on the condition that all of the circuit signal values of the operands specified by the parameter are FALSE, FALSE, on the condition that any of the circuit signal values of the operands specified by the parameter are TRUE, UNKNOWN, on all other combinations of circuit signal values of the operands specified by the parameter.

The processor further has logic XOR electronic devices and circuitry for encoding the following circuit signal values when the instruction is XOR:

TRUE, on the condition that an odd number of the circuit signal values of the operands specified by the parameter are TRUE and the rest FALSE, FALSE, on the condition that all of the circuit signal values of the operands specified by the parameter are FALSE, FALSE, on the condition that an even number circuit signal values of the operands specified by the parameter are TRUE and the rest FALSE, UNKNOWN, on all other combinations of circuit signal values of the operands specified by the parameter.

In an embodiment instructions are offered for AND, NAND, NOR, OR, and XOR for up to 8 inputs but more or fewer instruction may be offered and more inputs can be accommodated in another embodiment of the same invention. In an embodiment, only two bits are utilized to encode the four values but more bits may be optionally utilized and more values can be optionally accommodated in another embodiment of the present invention.

The default value encoded on the output bits corresponds to the circuit signal value of UNKNOWN, just as a logic simulator prior to the beginning of simulated time or initialization has all of its nets set to UNKNOWN.

In addition to pure logic evaluation instructions, the processor supports in native form certain instructions such as wide variable shift available in hardware description languages such as Verilog. Rather than performing the atomic steps in shifting data through a register, the processor has electronic devices and circuitry means for reading an input vector OLD, electronic devices and circuitry means for reading a plurality of scalars SHIFT, XOUT, executing means for executing a wide variable shift instruction comprising electronic devices and circuitry means for replicating the scalar XOUT to the width of the processor output vector OUT; electronic devices and circuitry means for shifting the input vector OLD to the right according to the binary value SHIFT; electronic devices and circuitry means for bit-wise OR operation of the shifted OLD vector with the replicated XOUT vector, electronic devices and circuitry means for assigning the result of the vector OR operation to the processor output vector OUT.

Another such instruction is Replace-Range. The processor further has input port electronic devices and circuitry means for reading an input vector NEW, electronic devices and circuitry means for reading a plurality of input scalars ENABLE, WIDTH, and scratchpad storage for storing a variable RSHAMT, and shift register or multiplexor circuits to execute a replace range instruction by shifting the input vector NEW to the left according to the decimal value SHIFT on the condition that bit 0 of ENABLE is true; shift register or multiplexor circuits to shift the input vector NEW to the right according to the decimal value RSHAMT assigned to be 32 minus SHIFT; multiplexor means for replacing some part of OLD with lower "WIDTH" plus 1 vector members of shifted vector NEW, a circuit tree for translating a decimal value of WIDTH to a binary mask, a multiplexor for assigning a replacement mask from a left shifted mask on the condition that the 0 bit of ENABLE is true, assigning from a right shifted mask if the 1 bit of ENABLE is true and the right shift amount RSHAMT is non zero, and assigning all bits to be zero if otherwise, means for replacing some part of OLD with lower "WIDTH" plus 1 vector members of NEW shifted left if 0th bit of enable is true or shifted right by 32 minus shift if 0th bit of enable is false and bit-wise OR'ing the resulting combination of OLD and NEW with the result of replicated XOUT.

In the event that inputs require greater than 64 bit inputs the embodiment of the processor uses a method, the method comprising: generating a plurality of wide variable shift instructions and a plurality of replace range instructions, padding the most significant input bits with zeros to fit the available input width, applying the instructions to overlapping or to contiguous members of the circuit signal value vectors, assigning the instructions to a plurality of processors, storing intermediate values and ORing the results.

Such processors disclosed in the present invention may be custom designed electronic devices but for economies are more likely programmed onto an existing array of logic cells or logic gates. Thus the interconnection among an underlayment of logic gates may be read from a computer readable medium and device programmed in a variety of ways. These methods of programming an electronic device to perform evaluation processor operations comprises one or more of the following steps: making fuses or anti-fuses conductive or non-conductive, injecting charge to floating gates, storing a binary pattern on a computer readable medium, applying current or voltage to a memory controlling a pass transistor, and recording a tape to define an image of conductive or non-conductive traces or polygons in a mask, the method further comprises but is not limited to the steps of configuring an electronic device to read one or more instructions selected from the group of instructions following: AND, OR, NAND, NOR, XOR; configuring an electronic device to read a plurality of operands which represent input circuit signal values selected from the group following: UNKNOWN, TRUE, FALSE, HIGH-IMPEDANCE; configuring an electronic device to encode on a plurality of output bits the circuit signal values which result from applying said instruction to said plurality of operands, wherein the plurality of operands simultaneously read and evaluated in one step are four or more, and wherein the plurality of circuit signal values read or encoded in one step are four or more.

An article of manufacture is disclosed comprising a computer readable medium on which is encoded the computer implementable steps for programming an electronic device to perform evaluation processor operations, the steps comprising the method of the present invention. A computer program product is disclosed for producing masks, fuse maps, charge storage or files for configuring gate arrays, programmable logic devices, or semicustom integrated circuits which perform the present invention.

What is claimed is:

1. A processor, for evaluating circuit signal values of an electronic design, comprising operand inputting electronic devices and circuitry for reading four or more operands, instruction input electronic devices and circuitry for reading one or more processor instructions, and encoding electronic devices and circuitry for encoding four or more circuit signal values onto a plurality of output bits, the processor further comprising electronic devices and circuitry for reading an input vector OLD, electronic devices and circuitry for reading a plurality of scalars SHIFT, XOUT, executing electronic devices and circuitry for executing a wide variable shift instruction comprising electronic devices and circuitry for replicating the scalar XOUT to the width of the processor output vector OUT; electronic devices and circuitry for shifting the input vector OLD to the right according to the binary value SHIFT; electronic devices and circuitry for bit-wise OR operation of the shifted OLD vector with the replicated XOUT vector, electronic devices and circuitry for assigning the result of the vector OR operation to the processor output vector OUT further comprising electronic devices and circuitry for reading an input vector NEW, electronic devices and circuitry for reading a plurality of input scalars ENABLE, WIDTH, and storing electronic devices and circuitry for storing a variable RSHAMT, executing electronic devices and circuitry for executing a replace range instruction by shifting the input vector NEW to the left according to the decimal value SHIFT on the condition that bit 0 of ENABLE is true; electronic devices and circuitry for shifting the input vector NEW to the right according to the decimal value RSHAMT assigned to be 32 minus SHIFT; electronic devices and circuitry for replacing some part of OLD with lower "WIDTH" plus 1 vector members of shifted vector NEW, electronic devices and circuitry for translating a decimal value of WIDTH to a binary mask, electronic devices and circuitry for assigning a replacement mask from a left shifted mask on the condition that the 0 bit of ENABLE is true, assigning from a right shifted mask if the 1 bit of ENABLE is true and the right shift amount RSHAMT is non zero, and assigning all bits to be zero if otherwise, electronic devices and circuitry for replacing some part of OLD with lower "WIDTH" plus 1 vector members of NEW shifted left if 0th bit of enable is true or shifted right by 32 minus shift if 0th bit of enable is false and bit-wise OR'ing the resulting combination of OLD and NEW with the result of replicated XOUT.

2. A method of programming an electronic device to perform evaluation processor operations wherein programming comprises one or more of the steps comprising the group: making fuses or anti-fuses conductive or non-conductive, injecting charge to floating gates, storing a binary pattern on a computer readable medium, applying current or voltage to a memory controlling a pass transistor, and recording a tape to define an image of conductive or non-conductive traces or polygons in a mask, the method comprising the steps of
 configuring an electronic device to
  read an input vector OLD,
  read a plurality of scalars SHIFT, XOUT,
  execute a wide variable shift instruction,
  replicate the scalar XOUT to the width of the processor output vector OUT;
  shift the input vector OLD to the right according to the binary shift value SHIFT;
  bit-wise OR operation of the shifted OLD vector with the replicated XOUT vector,
  assign the result of the vector OR operation to the processor output vector OUT, and
  read a plurality of input scalars ENABLE, WIDTH, and store a variable RSHAMT,
  execute a replace range instruction by shifting the input vector NEW to the left according to the decimal value SHIFT on the condition that bit 0 of ENABLE is true;
  shift the input vector NEW to the right according to the decimal value RSHAMT assigned to be 32 minus SHIFT;
  replace some part of OLD with lower "WIDTH" plus 1 vector members of shifted vector NEW,
  translate a decimal value of WIDTH to a binary mask,
  assign a replacement mask from a left shifted mask on the condition that the 0 bit of ENABLE is true and the right shift amount RSHAMT is non-zero, and assigning all bits to be zero if otherwise,
  replace some part of OLD with lower "WIDTH" plus 1 vector members of NEW shifted left if $0^{th}$ bit of enable is true or shifted right by 32 minus SHIFT if $0^{th}$ bit of ENABLE is false and bit-wise OR the resulting combination of OLD and NEW with the result of replicated XOUT
 and to read at least one instruction selected from the group of instructions following: AND, OR, NAND, NOR, XOR;
 configuring an electronic device to read a plurality of operands which represent input circuit signal values selected from the group following: UNKNOWN, TRUE, FALSE, HIGH-IMPEDANCE;
 configuring an electronic device to encode on a plurality of output bits the circuit signal values which result from applying said instruction to said plurality of operands,
 wherein the plurality of operands simultaneously read and evaluated in one step are four or more, and wherein the plurality of circuit signal values read or encoded in one step are four or more.

3. An article of manufacture comprising a program product tangibly embodied on a computer readable medium to effect the programming of an electronic device to perform evaluation processor operations, the steps comprising:
 configuring an electronic device to
 read an input vector OLD,
 read a plurality of scalars SHIFT, XOUT,
 execute a wide variable shift instruction,
 replicate the scalar XOUT to the width of the processor output vector OUT;
 shift the input vector OLD to the right according to the binary shift value SHIFT;
 bit-wise OR operation of the shifted OLD vector with the replicated XOUT vector,
 assign the result of the vector OR operation to the processor output vector OUT, and
 read a plurality of input scalars ENABLE, WIDTH, and store a variable RSHAMT,
 execute a replace range instruction by shifting the input vector NEW to the left according to the decimal value SHIFT on the condition that bit 0 of ENABLE is true;
 shift the input vector NEW to the right according to the decimal value RSHAMT assigned to be 32 minus SHIFT;
 replace some part of OLD with lower "WIDTH" plus 1 vector members of shifted vector NEW,
 translate a decimal value of WIDTH to a binary mask, assign a replacement mask from a left shifted mask on the condition that the 0 bit of ENABLE is true and the right shift amount RSHAMT is non-zero, and assigning all bits to be zero if otherwise,
 replace some part of OLD with lower "WIDTH" plus 1 vector members of NEW shifted left if $0^{th}$ bit of enable is true or shifted right by 32 minus SHIFT if $0^{th}$ bit of ENABLE is false and bit-wise OR the resulting combination of OLD and NEW with the result of replicated XOUT
 and to read one or more instructions selected from the group of instructions following: AND, OR, NAND, NOR, XOR;
 configuring an electronic device to read a plurality of operands which represent input circuit signal values selected from the group following: UNKNOWN, TRUE, FALSE, HIGH-IMPEDANCE;

configuring an electronic device to encode on a plurality of output bits the circuit signal value which result from applying said instruction to said plurality of operands, wherein the plurality of operands simultaneously read and evaluated in one step are four or more, and wherein the plurality of circuit signal values read or encoded in one step comprise four or more distinguishable values.

* * * * *